United States Patent
Bernardon

(10) Patent No.: US 6,750,697 B2
(45) Date of Patent: Jun. 15, 2004

(54) CONFIGURATION AND METHOD FOR SWITCHING TRANSISTORS

(75) Inventor: Derek Bernardon, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/206,300

(22) Filed: Jul. 26, 2002

(65) Prior Publication Data

US 2003/0062943 A1 Apr. 3, 2003

(30) Foreign Application Priority Data

Jul. 26, 2001 (DE) ........................................ 101 36 320

(51) Int. Cl.[7] .............................................. H03K 17/04
(52) U.S. Cl. ........................................ 327/374; 327/112
(58) Field of Search ............................... 327/108, 112, 327/374–377, 379, 437, 383, 384, 389, 391, 427, 434; 326/82–83

(56) References Cited

U.S. PATENT DOCUMENTS

| 4,274,014 A | | 6/1981 | Schade, Jr. ............... 327/437 |
|---|---|---|---|
| 5,021,684 A | * | 6/1991 | Ahuja et al. ............... 326/27 |
| 5,120,992 A | * | 6/1992 | Miller et al. ............... 327/111 |
| 5,311,145 A | | 5/1994 | Huijsing et al. ............ 330/255 |
| 5,329,177 A | | 7/1994 | Nagai ...................... 326/12 |
| 5,717,342 A | * | 2/1998 | Lotfi et al. ............... 326/17 |
| 6,051,995 A | * | 4/2000 | Pollachek ................ 326/87 |

FOREIGN PATENT DOCUMENTS

| EP | 0 344 604 A2 | 12/1989 |
|---|---|---|
| JP | 61170129 A | 7/1986 |
| JP | 61170130 A | 7/1986 |
| JP | 07 221 625 | 8/1995 |
| JP | 11317653 A | 11/1999 |
| WO | 99/63667 | 12/1999 |

* cited by examiner

*Primary Examiner*—My-Trang Nuton
(74) *Attorney, Agent, or Firm*—Laurence A. Greenberg; Werner H. Stemer; Ralph E. Locher

(57) ABSTRACT

A configuration and a method for the simultaneous switching of transistors connected in series, one from the on state to the off state and the other from the off state to the on state ensures that, when the transistors are switched from the on state to the off state or from the off state to the on state, the gate potential of the transistor that is changed from the off state to the on state by the switching operation changes more slowly than the gate potential of the transistor that is changed from the on state to the off state by the switching operation.

35 Claims, 5 Drawing Sheets

Prior Art

CONFIGURATION AND METHOD FOR SWITCHING TRANSISTORS

BACKGROUND OF THE INVENTION

Field of the Invention

The present invention relates to a configuration and a method for the simultaneous switching of a transistor in the on state to the off state and of a transistor connected in series therewith and in the off state to the on state.

A circuit that contains two transistors to be so operated is shown in FIG. 5.

The circuit shown includes a PMOS transistor P and an NMOS transistor N connected in series therewith. The transistor P is connected to the first terminal hSup of a supply voltage. The transistor N is connected to the second terminal lSup of the supply voltage. The gate terminals of the transistors P and N are connected to a digital input signal DIGIN of the configuration and a digital output signal DIGOUT is tapped off from the configuration between the transistors P and N.

Of the transistors P and N, regardless of the level of the input signal DIGIN, in each case one of the transistors is on and the respective other transistor is off.

In the event of a change in the level of the input signal DIGIN, the transistor in the on state is changed to the off state, and the transistor in the off state is changed to the on state.

Such a configuration is used, for example, in an inverter.

Existing problems of such configurations lie in the fact that, during the simultaneous switching of the transistors, there is a phase during which both transistors are on. In such a phase, the first terminal hSup and the second terminal lSup of the supply voltage are short-circuited through the transistors P and N.

Such a condition is disadvantageous for various reasons. In particular, a very high current flows in the short-circuit phases:

which leads to severe heating of the configuration and can even destroy the transistors P and N; and which can have the consequence that, on parasitic inductances that are present in series with the transistors P and N, considerable voltages may drop, because of the large di/dt, which results in considerable disruption to the output signal DIGOUT, in particular, in the case of switching operations that follow one another rapidly.

There already exist a large number of proposals in the prior art for the elimination of the aforementioned problems. However, such proposals can be implemented only with a great outlay and/or are not able to eliminate the aforementioned problems satisfactorily.

SUMMARY OF THE INVENTION

It is accordingly an object of the invention to provide a configuration and method for switching transistors that overcome the hereinafore-mentioned disadvantages of the heretofore-known devices and methods of this general type and that, in a simple manner, reliably and without accepting other disadvantages, prevents short circuits from occurring when switching the transistors.

With the foregoing and other objects in view, there is provided, in accordance with the invention, a circuit configuration for a simultaneous switching of transistors, including first and second transistors connected in series, each of the transistors having a gate terminal with a gate potential, an on state, and an off state, and the transistors respectively switching one of from the on state to the off state in an off transition and from the off state to the on state in an on transition, and when the transistors are switched, the gate potential of one of the transistors performing the on transition being changed slower than the gate potential of another of the transistors performing the off transition.

With the objects of the invention in view, there is also provided a method for simultaneously switching transistors, including the steps of respectively switching first and second transistors connected in series one of from an on state to an off state in an off transition and from the off state to the on state in an on transition, with a gate potential of one of the transistors performing the on transition being changed slower than a gate potential of another of the transistors performing the off transition.

The configuration and method according to the invention are distinguished by the fact that they ensure that, when the transistors are switched from the on state to the off state or from the off state to the on state, the gate potential of the transistor that is changed from the off state to the on state by the switching operation changes more slowly than the gate potential of the transistor that is changed from the on state to the off state by the switching operation.

As a result, the transistor that was originally off can only pass into the on state when the originally on transistor is no longer in the completely turned-on state, even in the case in which the switching of the transistors is started at the same time. The result of such a configuration is that, at no time can both transistors simultaneously be in the fully on state; during the switching operation, at least one of the transistors is in a state in which it acts as a current source that limits the current flow through the transistors.

By the claimed configuration and the claimed method, it is consequently possible, in a simple way, reliably and without accepting other disadvantages, to prevent short-circuits from occurring when switching the transistors.

In accordance with another feature of the invention, when the transistors are switched one of from the on state to the off state and from the off state to the on state, the gate potentials of the transistors are ensured to begin to change simultaneously.

In accordance with a further feature of the invention, there is provided a driving configuration connected to the transistors, the driving configuration, during switching of the transistors, driving the transistors to cause at least one of the transistors to act as a current source limiting current flow through the transistors in phases during which neither of the transistors is in the off state.

In accordance with an added feature of the invention, one of the transistors is a PMOS transistor, and another of the transistors is an NMOS transistor.

In accordance with an additional feature of the invention, each of the transistors has a source terminal, the source terminal of the first transistor is to be connected to a first terminal of a supply voltage, and the source terminal of the second transistor is to be connected to a second terminal of the supply voltage.

In accordance with yet another feature of the invention, one of the on state and the off state of a respective one of the transistors is to be dependent upon an input signal and the input signal does not drive the transistors.

In accordance with yet a further feature of the invention, there is provided a first supply voltage terminal, a second supply voltage terminal, a first additional transistor, a second additional transistor, the gate terminal of the first transistor connected through the first additional transistor to the first supply voltage terminal, and the gate terminal of the second transistor connected through the second additional transistor to the second supply voltage terminal.

In accordance with yet an added feature of the invention, each of the first and second additional transistors have a gate terminal, an on state, and an off state, and the gate terminals of the first and second additional transistors are to be driven respectively in one of the on state and the off state.

In accordance with yet an additional feature of the invention, the gate terminals of the additional transistors are to be driven by one of an input signal and a signal based upon the input signal.

In accordance with again another feature of the invention, there is provided a third additional transistor to be driven as a function of a voltage between the first and second transistors and an input signal, and the gate terminal of the first transistor connected through the third additional transistor to the first voltage supply terminal.

In accordance with again a further feature of the invention, there is provided a fourth additional transistor to be driven as a function of a voltage present on the gate terminal of the second transistor and the input signal, and the gate terminal of the first transistor connected through the fourth additional transistor to the first voltage supply terminal.

In accordance with again an added feature of the invention, there is provided a fifth additional transistor to be driven as a function of a voltage between the first and second transistors and the input signal, and the gate terminal of the second transistor connected through the fifth additional transistor to the second voltage supply terminal.

In accordance with again an additional feature of the invention, there is provided a sixth additional transistor to be driven as a function of a voltage present on the gate terminal of the first transistor and the input signal, and the gate terminal of the second transistor connected through the sixth additional transistor to the second voltage supply terminal.

In accordance with still another feature of the invention, the gate terminal of the first transistor and the gate terminal of the second transistor are connected through at least one resistive element, preferably, a transistor.

In accordance with a concomitant feature of the invention, the at least one resistive element is to be driven by a bias current.

Other features that are considered as characteristic for the invention are set forth in the appended claims.

Although the invention is illustrated and described herein as embodied in a configuration and method for switching transistors, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
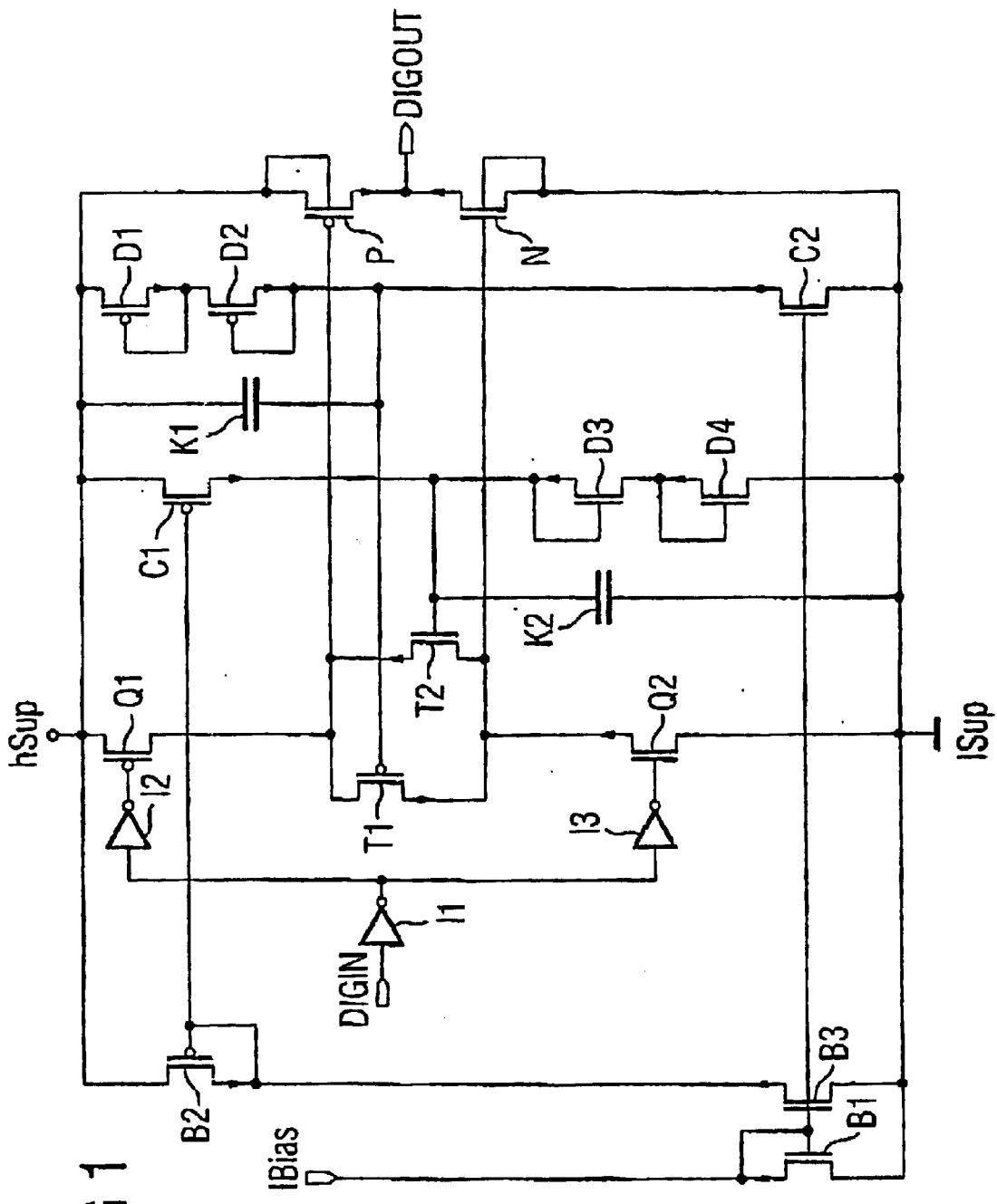
FIG. 1 is a schematic circuit diagram of a first exemplary embodiment of a configuration for the simultaneous switching of two transistors connected in series and in different switching states according to the invention.

Referring now to the figures of the drawings in detail and first, particularly to FIG. 1 thereof, there is shown a configuration including PMOS transistors P, B2, C1, D1, D2, Q1, T1, NMOS transistors N, B1, B3, C2, D3, D4, Q2, T2, capacitors K1, K2, and inverters I1, I2, I3.

The transistors that are to be switched substantially simultaneously are the PMOS transistor P and the NMOS transistor N. These transistors are connected in series and disposed between the positive terminal hSup and the negative terminal lSup of a supply voltage. Put more precisely, the transistor P is connected to the positive terminal hsup, and the transistor N is connected to the negative terminal lSup of the supply voltage. In the example being considered, the negative terminal lSup of the supply voltage corresponds to ground or earth potential.

At this point, it is noted that:

the transistors P and N to be switched can also be interchanged (connected to the respective other terminals of the supply voltage);

the transistors to be switched may also be transistors of the same type driven in complementary fashion; and/or the transistors can also be transistors other than MOS transistors (for example, bipolar transistors).

Figure 5:
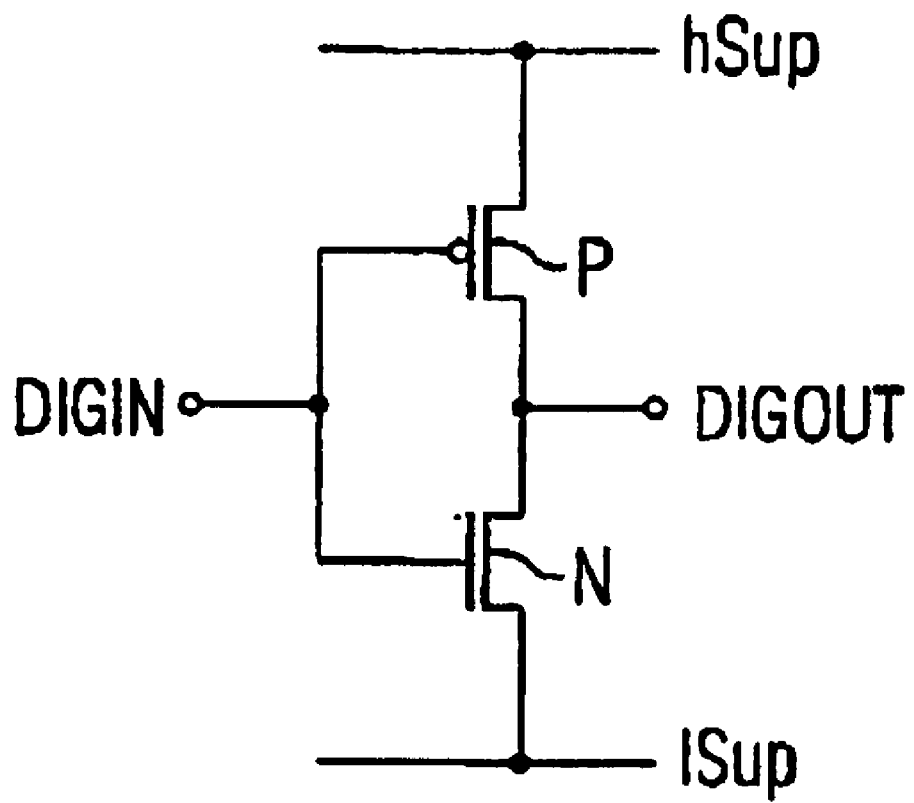
FIG. 5 is a schematic circuit diagram of a conventional circuit having two transistors connected in series, the transistors having a different switching state and being respectively switched simultaneously.

The substantially simultaneous switching of the transistors P and N is caused by a digital signal DIGIN, which, at the same time, is the input signal for the configuration. As opposed to the configuration shown in FIG. 5, however, the signal is not applied directly to the gate terminals of the transistors P and N.

The signal DIGIN is supplied through the inverters I1 and I2 to the gate terminal of the transistor Q1, and through the inverters I1 and I3 to the gate terminal of the transistor Q2, the transistor Q1 connecting the gate terminal of the transistor P to the positive terminal hsup of the supply voltage, and the transistor Q2 connecting the gate terminal of the transistor N to the negative terminal lSup of the supply voltage.

The gate terminals of the transistors P and N are additionally connected to each other through the transistor T1 and the transistor T2 disposed in parallel therewith.

The gate voltage of the transistor T1 is tapped off at a voltage divider disposed in parallel with the transistors P and N and including the transistors D1, D2, and C2. The transistors D1, D2, and C2 are connected in series, the transistor D1 being connected to the positive terminal hSup of the supply voltage, the transistor C2 being connected to the negative terminal lsup of the supply voltage, and the transistors D1 and D2 being used as diodes. The voltage that is fed to the gate terminal of the transistor T1 is tapped off at a point located between the transistors D2 and C2.

The transistors T1, D1, D2, and C2 are dimensioned such that the current flowing through these during the switching of the transistors P and N, and, specifically, only this current, is limited. Such a process will be explained in more detail later.

The transistor C2 is a constituent part of a balanced circuit formed by the transistors B1, B3, and C2, the magnitude of the currents flowing through the transistors B3 and C2 depending on the current that flows through the transistor B1. In the transistor B1, a current IBias is impressed. The transistor C2, consequently, constitutes a current source that outputs a current that can be adjusted through IBias; through the magnitude of such current, that is to say, ultimately through the bias current IBias, the gate potential of the transistor T1, and, therefore, the speed and the course of the charging or discharging of the gate terminals of the transistors P and N, can be varied.

The capacitor K1 is disposed between the gate terminal of the transistor T1 and the positive terminal hSup of the supply voltage, that is to say, in parallel with the transistors D1 and D2; the capacitor K1 serves to stabilize the gate voltage of the transistor T1.

The gate voltage of the transistor T2 already mentioned above is tapped off at a voltage divider disposed in parallel with the transistors P and N and including the transistors C1, D3, and D4. The transistors C1, D3, and D4 are connected in series, the transistor C1 being connected to the positive terminal hSup of the supply voltage, the transistor D4 being connected to the negative terminal lsup of the supply voltage, and the transistors D3 and D4 being used as diodes. The voltage that is fed to the gate terminal of the transistor T2 is tapped off at a point located between the transistors C1 and D3.

The transistors, T2, C1, D3, and D4 are dimensioned such that the current flowing through these during the switching of the transistors P and N, and, specifically, only such current, is limited. Such process will be explained in more detail later.

The transistor C1 is a constituent part of a balanced circuit formed by the transistors B2 and C1, the magnitude of the current flowing through the transistor C1 depending on the current flowing through the transistor B2. The transistor B2 is connected in series with the transistor B3. As a result, a current depending on IBias flows through the transistor B3.

The transistor C1, consequently, constitutes a current source that outputs a current that can be adjusted through IBias; through the magnitude of such current, that is to say, ultimately through the bias current IBias, the gate potential of the transistor T2, and, therefore, the speed and the course of the charging or discharging of the gate terminals of the transistors P and N, can be varied.

The capacitor K2 is disposed between the gate terminal of the transistor T2 and the negative terminal lSup of the supply voltage, that is to say, in parallel with the transistors D3 and D4; the capacitor K2 serves to stabilize the gate voltage of the transistor T2.

The configuration shown in FIG. 1 operates as set forth in the following text.

Initially, it is assumed that the configuration is in the steady state, and that DIGIN is equal to 0. Then, the transistor Q1 is on and the transistor Q2 is off. As a result, both the gate terminal of the transistor P and the gate terminal of the transistor N are pulled up to a high potential, which, in turn, results in a voltage of 0 V being established at a digital output terminal DIGOUT from the configuration, located between the transistors P and N.

If, starting from this point, the input signal DIGIN is switched to 1, the transistor Q1 passes into the off state, and the transistor Q2 passes into the on state. As a result, the potential established on the gate terminal of the transistor P and the potential established at the gate terminal of the transistor N begin to fall simultaneously.

The discharging of the gate terminal of the transistor N takes place very quickly because the gate terminal is connected to ground through the conductive transistor Q2. The discharging of the gate terminal of the transistor P takes place more slowly because the discharge current also has to flow through the transistors T1 and T2, which act as resistors.

As soon as the voltage established on the gate terminal of the transistor P reaches a specific value lying somewhat below its threshold voltage, the voltage does not fall any further. The gate voltage of the transistor P, at which this is the case, depends on the voltage drop across the transistor T1, which, in turn, depends on the driving of the transistor T1. In such a state, the transistor P acts as a current source, by which the current flowing through the transistors P and N between the positive terminal hSup and the negative terminal lSup of the supply voltage is limited.

The voltage that is established on the gate terminal of the transistor N and that is still high at the time at which the transistor P begins to act as a current source, continues to fall. The gate terminal of the transistor N is not discharged completely, however. As soon as the voltage established on the gate terminal of the transistor N reaches a specific value lying somewhat above its threshold voltage, the gate voltage does not fall any further. The gate voltage at which this is the case depends on the voltage drop across the transistor T2, which, in turn, depends on the driving of the transistor T2.

The transistor N then acts as a current source, which limits the current flowing through the transistors P and N between the positive terminal hSup and the negative terminal lSup of the supply voltage, and the gate terminal of the transistor P is discharged further through the transistors T1 and T2 acting as resistors. When the voltage established on the gate terminal of the transistor P reaches the voltage established on the gate terminal of the transistor P, the gate terminals of the transistors P and N are discharged to 0 V.

Figure 2:
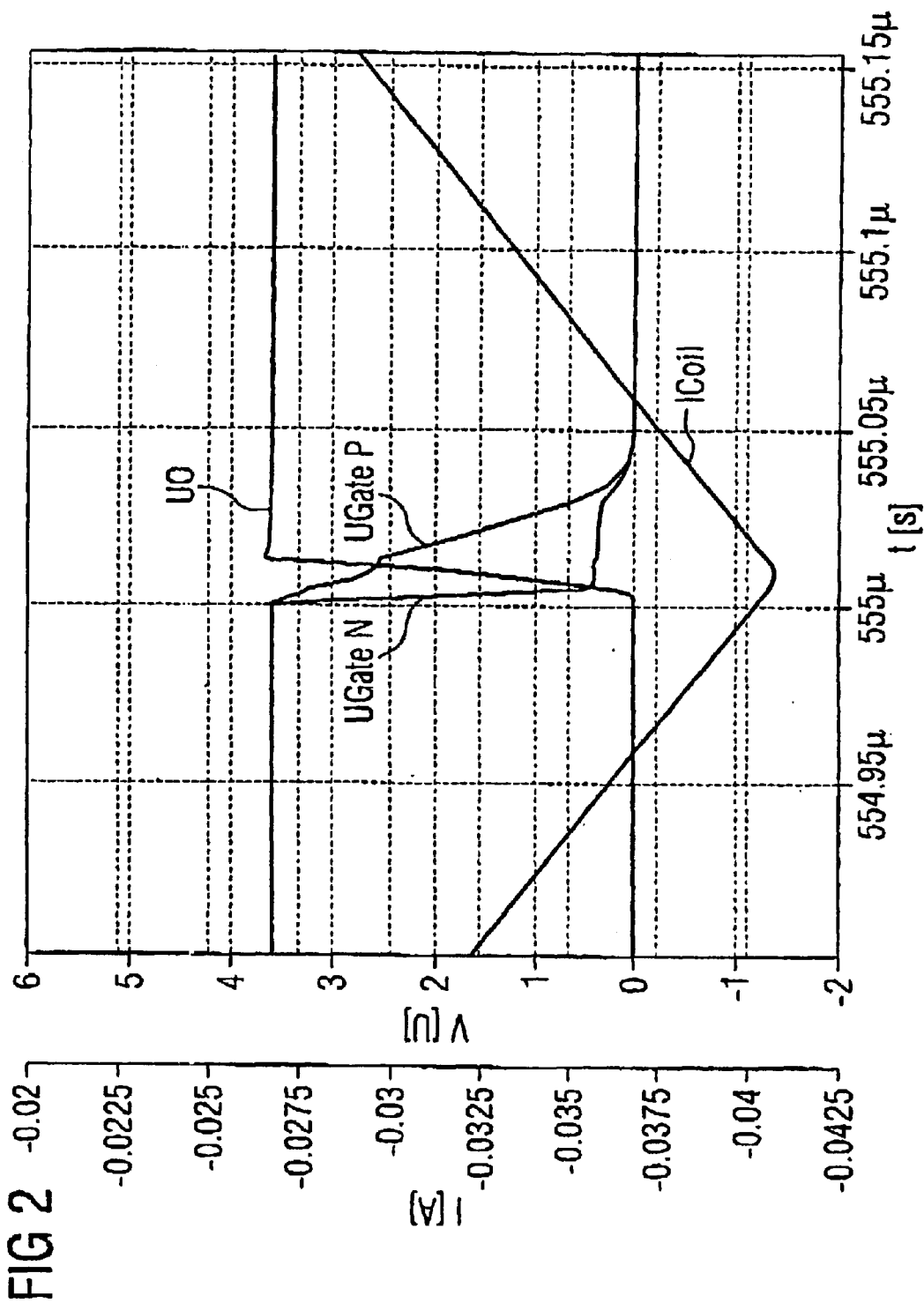
FIG. 2 is a graph indicating time variations of selected currents and voltages established during the switching of the transistors to be switched by the configuration of FIG. 1.

The waveforms that result when the input signal DIGIN is changed over from 0 to 1:
- of the voltage UgateN established on the gate terminal of the transistor N;
- of the voltage UgateP established on the gate terminal of the transistor P;
- of the voltage UO established on the output terminal DIGOUT of the configuration; and
- of the current ICoil, which is output across a coil connected to the output terminal DIGOUT of the configuration, are illustrated in FIG. 2.

The processes that proceed when the input signal DIGIN is changed over from 1 to 0 correspond to the processes that proceed when the input signal DIGIN is changed over from 0 to 1.

Figure 3:
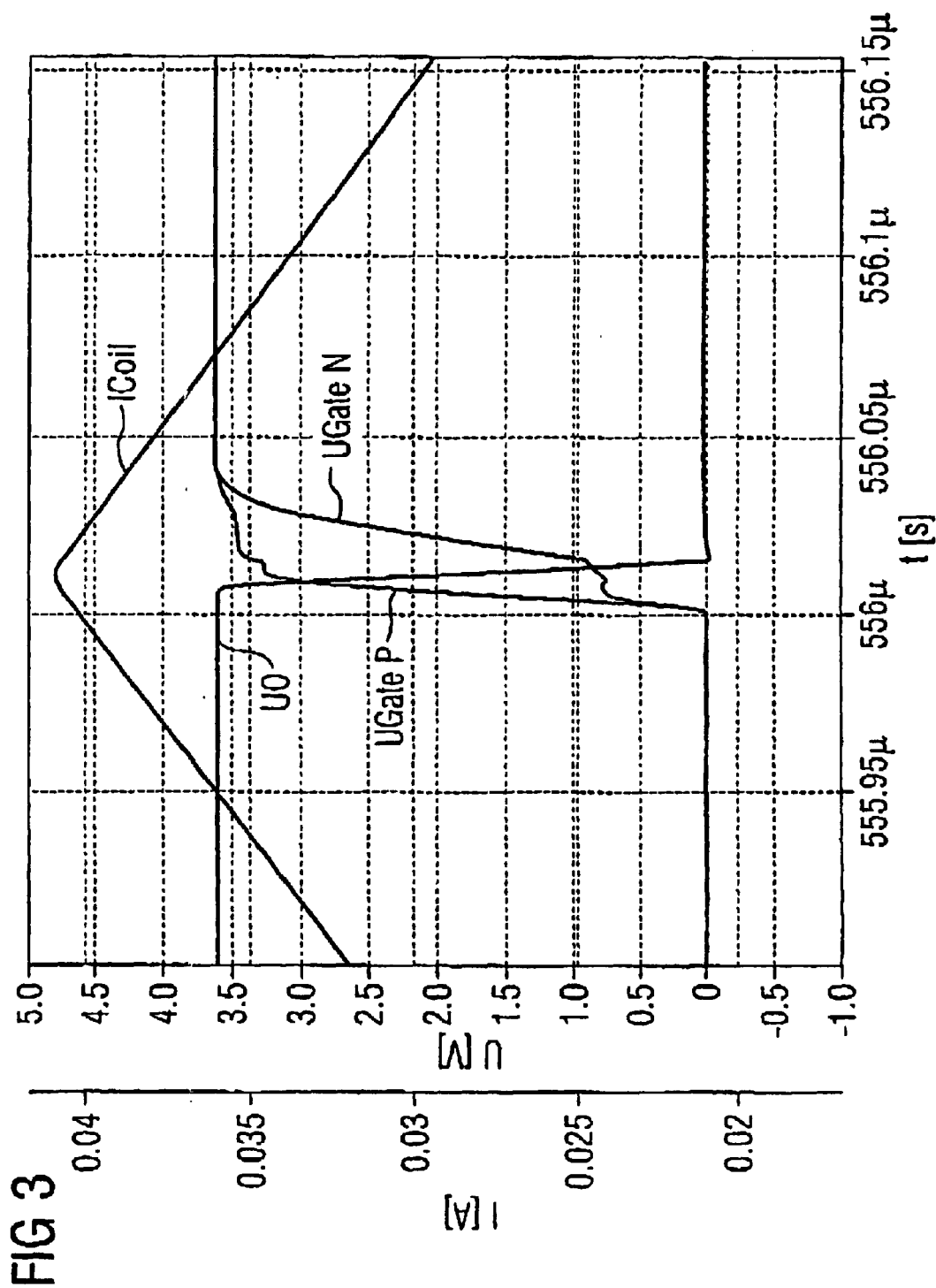
FIG. 3 is a graph indicating time variations of selected currents and voltages established during the renewed switching of the transistors to be switched by the configuration of FIG. 1.

The waveforms that result when the input signal DIGIN is changed over from 1 to 0:
- of the voltage UgateN established on the gate terminal of the transistor N;

of the voltage UgateP established on the gate terminal of the transistor P;

of the voltage UO established on the output terminal DIGOUT of the configuration; and of the current ICoil, which is output across a coil connected to the output terminal DIGOUT of the configuration, are illustrated in FIG. 3.

The advantage of the configuration shown in FIG. 1 lies in the fact that the terminals hsup and lSup of the supply voltage are at no time short-circuited through the transistors P and N. This is true even under changed or changing conditions: the current and voltage waveforms shown in FIGS. 2 and 3 are automatically adapted in the event of changes in the temperature and/or other parameters. Furthermore, the transistors P and N are driven without feedback so that no stability problems can arise either.

Figure 4:
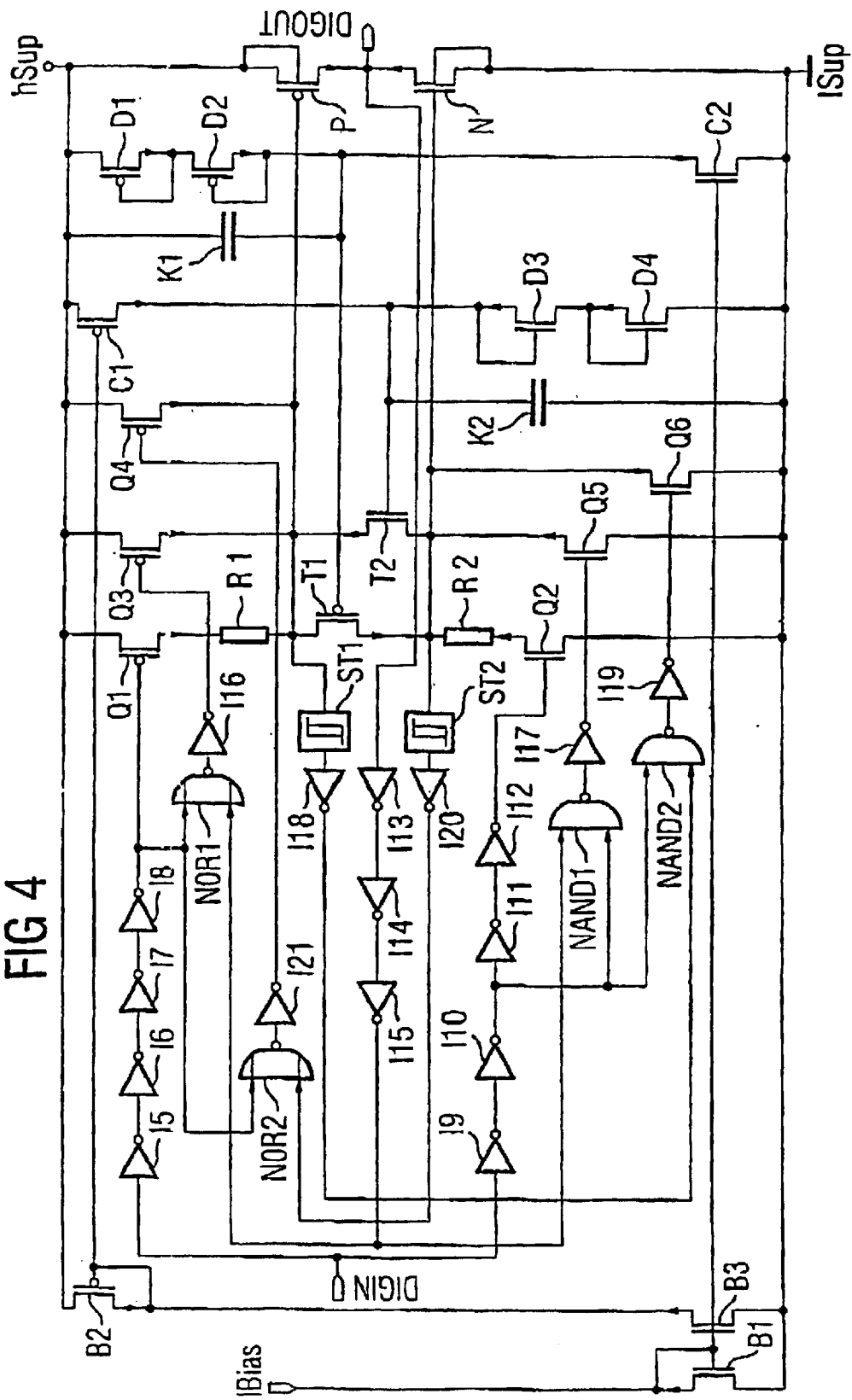
FIG. 4 is a schematic circuit diagram of a second exemplary embodiment of a configuration for the simultaneous switching of two transistors connected in series and in different switching states according to the invention.

FIG. 4 shows a second exemplary embodiment of a configuration for the simultaneous switching of two transistors that are connected in series and are in different switching states.

For the most part, the configuration shown in FIG. 4 corresponds to the configuration shown in FIG. 1. Components designated by the same reference symbols are identical or mutually corresponding components.

The differences that exist are as follows:

the input signal DIGIN is fed to the first additional transistor Q1 through series-connected inverters I5, I6, I7, I8, and to the second additional transistor Q2 through series-connected inverters I9, I10, I11, I12;

a resistor R1 is connected in series with the transistor Q1, and a resistor R2 is connected in series with the transistor Q2;

a PMOS transistor Q3 is disposed in parallel with the series circuit of transistor Q1 and resistor R1;

a PMOS transistor Q4 is disposed in parallel with the series circuit of transistor Q1 and resistor R1;

an NMOS transistor Q5 is disposed in parallel with the series circuit of transistor Q2 and resistor R2;

an NMOS transistor Q6 is disposed in parallel with the series circuit of transistor Q2 and resistor R2;

the third and fifth additional transistors Q3 and Q5 are driven as a function of the input signal DIGIN and the voltage established on the output terminal DIGOUT;

the fourth additional transistor Q4 is driven as a function of the input signal DIGIN and the voltage established on the gate terminal of the transistor N; and the sixth additional transistor Q6 is driven as a function of the input signal DIGIN and the voltage established on the gate terminal of the transistor P.

The transistors Q3 and Q5 are driven in detail as a function of the input signal DIGIN and the voltage established on the output terminal DIGOUT as set forth in the following text.

The voltage established on the output terminal DIGOUT is inverted by the series-connected inverters I13, I14, I15 and fed to a first input terminal of the NOR gate NOR1 and to a first input terminal of the NAND gate NAND1.

The second input terminal of the NOR gate NOR1 is fed with the input signal DIGIN inverted four times by the inverters I5 to I8 and, correspondingly, time-delayed. The NOR gate NOR1 subjects the signals fed to it to a NOR operation and outputs the result to the inverter I16. The inverter I16 inverts the signal fed to it and outputs the result to the gate terminal of the transistor Q3.

The second input terminal of the NAND gate NAND1 is fed with the input signal DIGIN inverted twice by the inverters I9 and I10 and, correspondingly, time-delayed. The NAND gate NAND1 subjects the signals fed to it to a NAND operation and outputs the result to the inverter I17. The inverter I17 inverts the signal fed to it and outputs the result to the gate terminal of the transistor Q5.

The transistor Q4 is driven in detail as a function of the input signal DIGIN and the voltage established on the gate terminal of the transistor N as set forth in the following text.

The voltage established on the gate terminal of the transistor N is fed to the Schmitt trigger ST2, and its output signal is forwarded through the inverter I20 to the first input terminal of the NOR gate NOR2.

The second input terminal of the NOR gate NOR2 is fed with the input signal DIGIN inverted four times by the inverters I5 to I8 and, correspondingly, time-delayed. The NOR gate NOR2 subjects the signals fed to it to a NOR operation and outputs the result to the inverter I21. The inverter I21 inverts the signal fed to it and outputs the result to the gate terminal of the transistor Q4.

The transistor Q6 is driven in detail as a function of the input signal DIGIN and the voltage established on the gate terminal of the transistor P as set forth in the following text.

The voltage established on the gate terminal of the transistor P is fed to the Schmitt trigger ST1, and its output signal is forwarded through the inverter I18 to the first input terminal of the NAND gate NAND2.

The second input terminal of the NAND gate NAND2 is fed with the input signal DIGIN inverted twice by the inverters I9 and I10 and, correspondingly, time-delayed. The NAND gate NAND2 subjects the signals fed to it to a NAND operation and outputs the result to the inverter I19. The inverter I19 inverts the signal fed to it and outputs the result to the gate terminal of the transistor Q6.

As can be seen from the preceding explanations, the transistors Q3 to Q6 additionally provided in the configuration shown in FIG. 4 are driven as a function of the relationships that are established in the configuration. The conditions under which these transistors are set on or off can be taken from the above-described construction of the parts of the configuration that drive the relevant transistors and do not require any further explanation.

By switching the transistors Q3 to Q6 on or off, it is possible to exert an influence on the speed with which the gate terminals of the transistors P and N are charged or discharged in the individual phases of the switching operation. As the result of switching individual or numbers of the transistors Q3 to Q6 on, the charging and discharging of the gate terminals of the transistors P and N can be accelerated. As a result, the operations that have to be carried out to switch the transistors P and N substantially simultaneously, without any short circuit, are matched in an optimum manner to the relationships that prevail in each case.

It should be clear, and not require any more detailed explanation, that the configuration shown in FIG. 4 is to be viewed only as an example of the practical implementation of a configuration by which the speed of charging and discharging of the gate terminals of the transistors P and N during the switching operation can be varied. It is possible to modify:

both the conditions under which the additional transistors Q3 to Q6 are switched on and off;

the construction of the parts of the circuit that control the additional transistors Q3 to Q6; and the manner in which the speed of charging and discharging of the gate terminals of the transistors P and N is varied.

As a result of the above-described configuration and the above-described method, regardless of the details of the practical implementation, it is possible, in a simple way and reliably, to prevent short circuits occurring during the switching of the transistors P and N.

I claim:

1. A circuit configuration for a simultaneous switching of transistors, comprising:

first and second transistors connected in series, each of said transistors having:
a gate terminal with a gate potential,
an on state, and
an off state;

said transistors respectively switching one of:
from said on state to said off state in an off transition, and
from said off state to said on state in an on transition;

said gate potential of one of said transistors performing said on transition being changed more slowly than said gate potential of another of said transistors performing said off transition; and a driving configuration connected to said transistors, said driving configuration, during switching of said transistors, driving said transistors to cause at least one of said transistors to act as a current source limiting current flow through said transistors in phases during which neither of said transistors is in said off state.

2. The circuit configuration according to claim 1, wherein said gate potentials of said transistors simultaneously begin to change when said transistors are switched respectively between said off and on transitions.

3. The circuit configuration according to claim 1, wherein said gate potentials of said transistors approximately simultaneously begin to change when said transistors are switched respectively between said off and on transitions.

4. The circuit configuration according to claim 1, wherein:
one of said transistors is a PMOS transistor; and
another of said transistors is an NMOS transistor.

5. The circuit configuration according to claim 1, wherein:
each of said transistors has a source terminal;
said source terminal of said first transistor is connected to a first terminal of a supply voltage; and
said source terminal of said second transistor is connected to a second terminal of the supply voltage.

6. The circuit configuration according to claim 1, wherein:
one of said on state and said off state of respective one of said transistors is to be dependent upon an input signal; and
the input signal does not drive said transistors.

7. The circuit configuration according to claim 1, including:
a first supply voltage terminal;
a second supply voltage terminal;
a first additional transistor;
a second additional transistor;
said gate terminal of said first transistor connected through said first additional transistor to said first supply voltage terminal; and
said gate terminal of said second transistor connected through said second additional transistor to said second supply voltage terminal.

8. The circuit configuration according to claim 7, wherein:
each of said first and second additional transistors have:
a gate terminal;
an on state; and
an off state; and
said gate terminals of said first and second additional transistors are to be driven respectively in one of said on state and said off state.

9. The circuit configuration according to claim 8, wherein said gate terminals of said additional transistors are to be driven by one of an input signal and a signal based upon said input signal.

10. The circuit configuration according to claim 8, including a third additional transistor to be driven as a function of:
a voltage between said first and second transistors; and
an input signal; and
said gate terminal of said first transistor connected through said third additional transistor to said first voltage supply terminal.

11. The circuit configuration according to claim 10, including a fourth additional transistor to be driven as a function of:
a voltage present on said gate terminal of said second transistor; and
the input signal; and
said gate terminal of said first transistor connected through said fourth additional transistor to said first voltage supply terminal.

12. The circuit configuration according to claim 11, including a fifth additional transistor to be driven as a function of:
a voltage between said first and second transistors; and
the input signal; and
said gate terminal of said second transistor connected through said fifth additional transistor to said second voltage supply terminal.

13. The circuit configuration according to claim 12, including a sixth additional transistor to be driven as a function of:
a voltage present on said gate terminal of said first transistor; and
the input signal; and
said gate terminal of said second transistor connected through said sixth additional transistor to said second voltage supply terminal.

14. The circuit configuration according to claim 13, wherein said gate terminal of said first transistor and said gate terminal of said second transistor are connected through at least one resistive element.

15. The circuit configuration according to claim 1, wherein said gate terminal of said first transistor and said gate terminal of said second transistor are connected through at least one resistive element.

16. The circuit configuration according to claim 14, wherein said at least one resistive element is a transistor.

17. The circuit configuration according to claim 16, said at least one resistive element is to be driven by a bias current.

18. A method for simultaneously switching transistors, which comprises:
respectively switching first and second transistors connected in series, the switching step being one of:
from an on state to an off state in an off transition; and
from the off state to the on state in an on transition,
while changing a gate potential of one of the transistors performing the on transition more slowly than a gate potential of another of the transistors performing the off transition; and
driving the transistors, during a switching, to change at least one of the transistors to act as a current source limiting current flow through the transistors when neither of the transistors are in the off state.

19. The method according to claim 18, which further comprises, when the transistors are switched one of from the on state to the off state and from the off state to the on state, ensuring the gate potentials of the transistors begin to change simultaneously.

20. The method according to claim 18, which further comprises, when the transistors switch one of in the off transition and the on transition, ensuring the gate potentials of the transistors begin to change simultaneously.

21. The method according to claim 18, wherein one of the transistors is a PMOS transistor, and another of the transistors is an NMOS transistor.

22. The method according to claim 18, which further comprises:
   connecting a source terminal of one of the transistors to a first voltage supply terminal; and
   connecting a source terminal of another of the transistors to a second voltage supply terminal.

23. The method according to claim 18, wherein:
   one of the on state and the off state of a respective one of the transistors is dependent upon an input signal; and
   the transistors are not driven with the input signal.

24. The method according to claim 18, which further comprises:
   providing a first supply voltage terminal and a second supply voltage terminal;
   connecting a gate terminal of the first transistor to the first supply voltage terminal through a first additional transistor; and
   connecting a gate terminal of the second transistor to the second supply voltage terminal through the second additional transistor.

25. The method according to claim 24, which further comprises driving the gate terminals of the first and second additional transistors to respectively be in one of the on state and the off state.

26. The method according to claim 25, which further comprises driving the gate terminals of the first and second additional transistors with one of an input signal and a signal based on the input signal.

27. The method according to claim 26, which further comprises:
   connecting the gate terminal of the first transistor to the first supply voltage terminal through a third additional transistor; and
   driving the third additional transistor as a function of:
      a voltage between the first and second transistors; and
      the input signal.

28. The method according to claim 27, which further comprises:
   connecting the gate terminal of the first transistor to the first voltage supply terminal through a fourth additional transistor; and
   driving the fourth additional transistor as a function of:
      a voltage present on the gate terminal of the second transistor; and
      the input signal.

29. The method according to claim 28, which further comprises:
   connecting the gate terminal of the second transistor to the second voltage supply terminal through a fifth additional transistor; and
   driving the fifth additional transistor as a function of:
      a voltage between the first and second transistors; and
      the input signal.

30. The method according to claim 29, which further comprises:
   connecting the gate terminal of the second transistor to the second voltage supply terminal through a sixth additional transistor; and
   driving the sixth additional transistor as a function of:
      a voltage present on the gate terminal of the first transistor; and
      the input signal.

31. The method according to claim 30, which further comprises connecting the gate terminal of the first transistor and the gate terminal of the second transistor through at least one resistive element.

32. The method according to claim 18, which further comprises connecting the gate terminal of the first transistor and the gate terminal of the second transistor through at least one resistive element.

33. The method according to claim 31, wherein the at least one resistive element is a transistor.

34. The method according to claim 33, which further comprises exerting influence on a driving of the first and second transistors with a bias current.

35. The method according to claim 33, which further comprises driving the first and second transistors with a bias current.

* * * * *